United States Patent [19]

Jester et al.

[11] 4,433,200
[45] Feb. 21, 1984

[54] ROLL FORMED PAN SOLAR MODULE

[75] Inventors: Theresa L. Jester, Palmdale; John W. Yerkes, Chatsworth; Charles F. Gay, Northridge; William R. Bottenberg, Thousand Oaks, all of Calif.

[73] Assignee: Atlantic Richfield Company, Los Angeles, Calif.

[21] Appl. No.: 307,912

[22] Filed: Oct. 2, 1981

[51] Int. Cl.³ .......................................... H01L 31/04
[52] U.S. Cl. ..................................... 136/251; 136/244
[58] Field of Search ............................... 136/251, 244

[56] References Cited

U.S. PATENT DOCUMENTS

| | | | |
|---|---|---|---|
| 4,057,439 | 11/1977 | Lindmayer | 136/251 |
| 4,067,764 | 1/1978 | Walker et al. | 156/267 |
| 4,167,644 | 9/1979 | Kurth et al. | 136/251 |
| 4,224,081 | 9/1980 | Kawamura et al. | 136/251 |
| 4,231,807 | 11/1980 | Keeling et al. | 136/251 |
| 4,239,555 | 12/1980 | Scharlack et al. | 136/251 |
| 4,322,261 | 3/1982 | Dubois | 156/280 |

OTHER PUBLICATIONS

D. C. Carmichael et al., "Materials for Encapsulation Systems for Terrestrial Photovoltaic Arrays", *Conf. Record, 12th IEEE Photovoltaic Specialists Conf.* (1976), pp. 317–331.

*Primary Examiner*—Aaron Weisstuch
*Attorney, Agent, or Firm*—Albert C. Metrailer

[57] ABSTRACT

A solar module comprising a solar cell string laminated between layers of pottant material and a transparent superstrate and a steel substrate. The steel substrate is roll formed to provide stiffening flanges on its edges while simultaneously forming a pan-shaped structure to hold other portions of the laminate in position during the laminating process. An improved terminal provides high voltage protection and improved mechanical strength. A conduit element provides protected raceways for external wires connected to module terminals.

9 Claims, 5 Drawing Figures

ROLL FORMED PAN SOLAR MODULE

BACKGROUND OF THE INVENTION

This invention relates to solar cell modules and more particularly to improved structures in such modules.

The use of solar cells, typically made from single crystal or polycrystalline silicon material, to produce electricity directly from solar insolation is well known. A typical solar cell can provide from one-half to four amperes of current at about one-half volt at peak insolation conditions. The typical commercial unit in which such cells are sold is a module containing one or more series circuits each comprising a plurality of cells sufficient to provide a useful output voltage. For example, thirty to thirty-five cells may be connected in series to provide an output working voltage around fifteen volts.

The delicate solar cell strings are usually laminated to a transparent superstrate using one or more layers of pottant material such as PVB (polyvinyl butyral), EVA (ethylene vinyl acetate) or EMA (ethylene methyl acrylate). A moisture and puncture resistant layer of a plastic and/or metal foil material is often added to the back of such modules for further protection. U.S. Pat. No. 4,067,764 issued to Walker et al. on Jan. 10, 1978 describes a typical solar cell panel and method of assembly using PVB as a pottant and a polyethylene terephthalate film as an outer protective shield. U.S. Pat. No. 4,224,081 issued to Kawamura et al. on Sept. 23, 1980 describes another solar module assembly using a rigid glass substrate.

The most common commercial module described above uses a flexible outer protective shield and depends almost entirely on the transparent superstrate, typically tempered glass, for its structural strength. Such modules are, therefore, difficult to handle and mount. As a result, the commercial modules usually include additional metal frame members, typically extruded aluminum channels, attached to and supporting all edges. The frame members typically interlock and include a groove, often filled with sealent, for tightly gripping the edges of the basic module. Frame members also include various flanges both for structural strength and for providing surfaces which may be used for attachment to supporting structures for a solar array.

It can be seen that in assembly of the basic module described above, there are no structural elements present to prevent sliding of the various laminate layers relative to each other and resulting misalignment. Such sliding may occur when pressure and heat are applied to the structure to cause the pottant layers to fuse together. In addition, the structural frame members are relatively expensive and require considerable hand labor for assembly to the basic module, thereby increasing the cost of the finished product. The reduction in cost of finished solar modules is essential if this renewable energy source is to displace fossil fuel energy sources.

SUMMARY OF THE INVENTION

Accordingly, an object of the present invention is to provide an improved solar cell module.

Another object of the present invention is to provide a solar cell module having a reduced number of structural components and requiring fewer steps for assembly.

A solar cell module, according to the present invention, comprises a generally rectangular metal substrate having upturned flanges on four sides forming a pan-shaped upper surface and downturned flanges extending from at least two of the upturned flanges and extending below the lower surface of the pan structure to act as stiffening ribs. The module further includes a first pottant sheet, a string of solar cells, a second pottant sheet and a transparent superstrate positioned in that order in the pan-shaped substrate and laminated to fuse the pottant sheets together and thereby seal the solar cells in a protective structure. An improved terminal including an insulating housing having a flange which engages a portion of the metal substrate extends through the substrate to provide mechanical protection for an electrical contact extending from the solar cell string. In a preferred form, the terminals are located near an edge of the module and the module includes a removable U-shaped conduit which interlocks with part of the flange structure to form a protected raceway for external leads connected to the module.

BRIEF DESCRIPTION OF THE DRAWINGS

The pesent invention may be more fully understood by reading the following detailed description with reference to the accompanying drawings wherein.

DESCRIPTION OF THE PREFERRED EMBODIMENT

Figure 1:
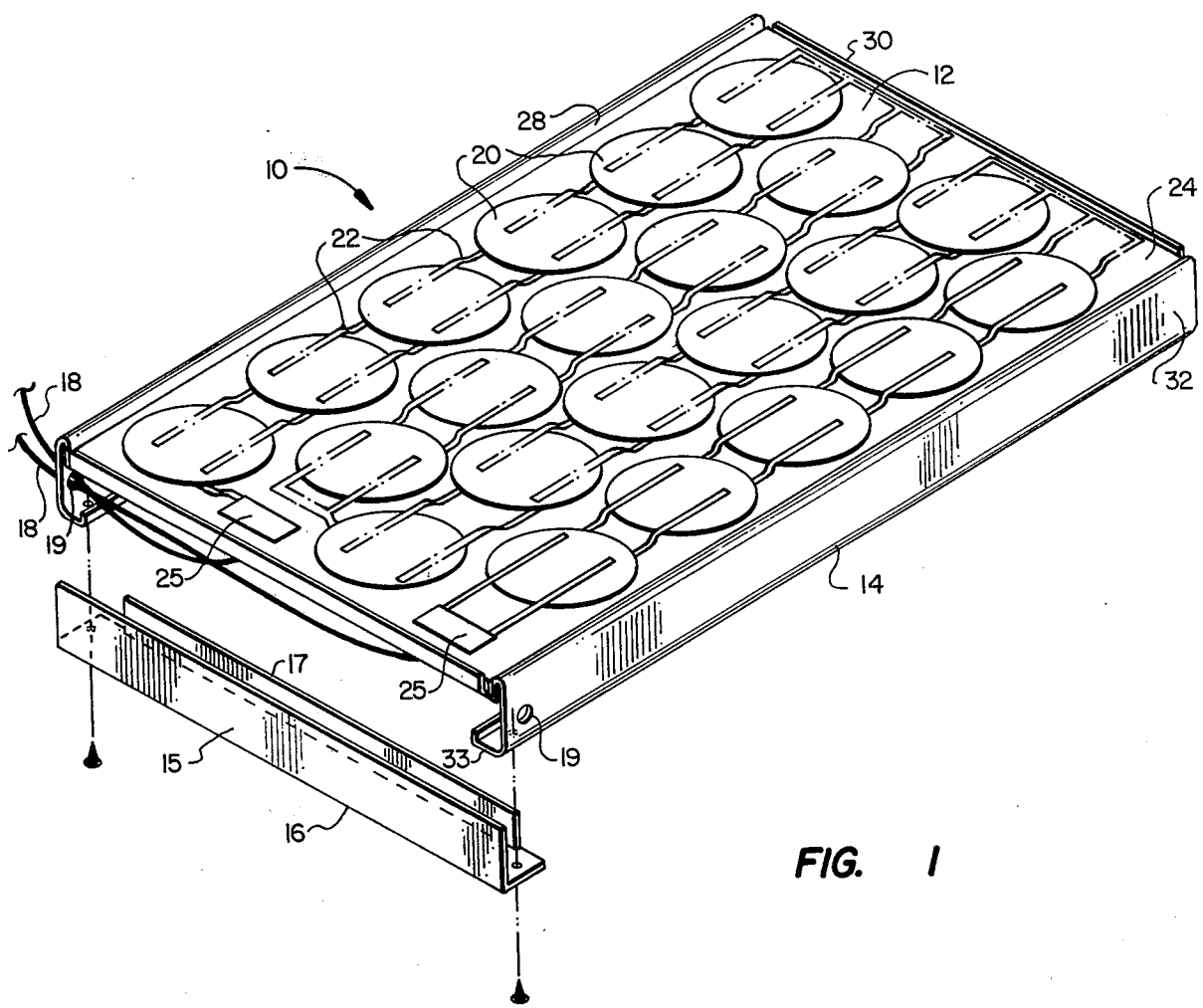
FIG. 1 is an isometric view of a solar cell module according to the present invention with a conduit member shown in exploded view.

FIG. 1 illustrates a complete solar cell module 10 according to the present invention. This illustration shows primarily the top surface 12 of a pan substrate 14 and the remaining module components as assembled on substrate 14. Also illustrated in exploded view in FIG. 1 is a conduit channel 16 which, when attached to the lower surface of module 10, forms an enclosed raceway for external leads 18. The basic electrical circuit of module 10 comprises a plurality of solar cells 20 interconnected in series by conductors 22. In a preferred form, thirty-four of the cells 20 are interconnected to form a series circuit between a pair of terminal pads 25. In this preferred embodiment, each of the cells 22 is formed from single crystal silicon in a conventional manner and has a diameter of approximately 5.5 inches. Other size cells and other configurations besides a single series string are well known in the art and may be used in place of that illustrated. As will be described in more detail with reference to FIGS. 3 and 4, the solar cells 20 are held between substrate 14 and a glass superstrate 24 by layers of a pottant which in the preferred embodiment is ethylene methyl acrylate, hereinafter referred to as EMA. The EMA pottant is preferred because it is thermoplastic although a thermosetting pottant, such as EVA, is also suitable.

Figure 2:
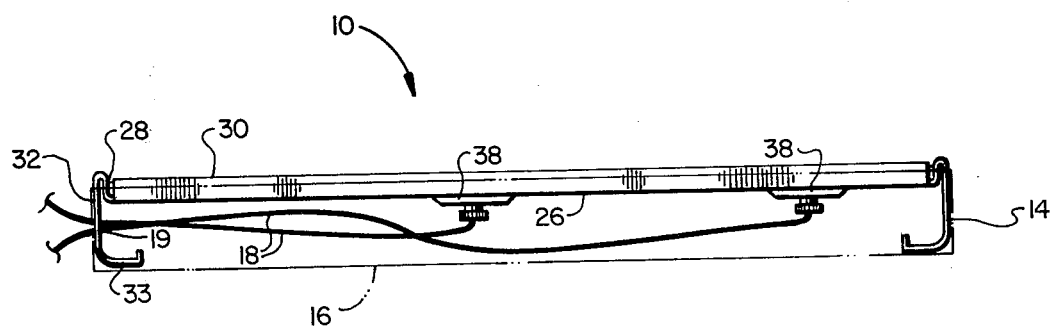
FIG. 2 is an end view of the module of FIG. 1 with the conduit member shown in phantom.

With reference to FIGS. 1 and 2, the structure and assembly of conduit 16 will be described. Conduit 16 is a simple U-channel form having arm portions 15 and 17 extending from a central portion. The outer arm 15 extends the full length of conduit 16 which corresponds to the width of module 10. The width of arm 15 is sufficient to extend from mounting flanges 33 to at least partially overlap upturned flanges 30 as shown in the phantom illustration of conduit 16 in FIG. 2. The inner arm 17 is smaller than arm 15 both in length and width. Arm 17 is short enough to fit between the innermost edges of mounting flanges 33 and has a width corresponding to the distance from mounting flange 33 to the lower surface 26 of pan substrate 14. When conduit 16 is fastened to substrate 14 it forms a protective raceway for wires 18 which may then be routed through an apertures 19 in downturned flanges 32 to adjacent modules 10 or an external conduit.

Figure 3:
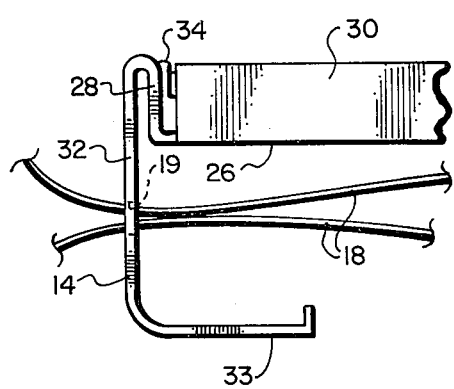
FIG. 3 is a larger scale view of a portion of FIG. 2.

With reference to FIGS. 2 and 3, as well as FIG. 1, details of the structure of substrate 14, which may also be referred to as a roll formed pan, will be described. In this preferred embodiment, substrate 14 is formed from a single sheet of twenty-two gauge (0.03 inch thick) steel by conventional roll forming techniques. Substrate 14 is preferrably protected against corrosion by means of an aluminized coating such as that provided under the trademark Galvalume TM. As seen in FIG. 1 substrate 14 has an essentially rectangular flat central portion having upper surface 12 and lower surface 26. The edges of upper surface 12 are provided with upturned flanges 28 and 30. As seen in the drawings, the substrate 14 terminates at the top edge of upturned flanges 30 which extend along the shorter sides of substrate 14. On the other hand, upturned flanges 28 are formed integrally with downturned flanges 32 which extend substantially below the lower surface 26 of the central portion of substrate 14. The downturned flanges 32 further include mounting flanges 33 formed at right angles to the downturned flanges 32 and parallel to the lower surface 26 of substrate 14. Flanges 32 and 33 together form L-shaped structural members which provide primary rigidity to module 10 along its length. Upturned flanges 28 and 30 provide further stiffening of all edges of module 10 and also form a pan in which the other module components are assembled.

Also illustrated in FIG. 2 are electrical terminals 38. These terminals provide means for connecting the external leads 18 to the terminal pads 25. The internal structure of terminals 38 is described in detail below with reference to FIG. 5.

Figure 4:
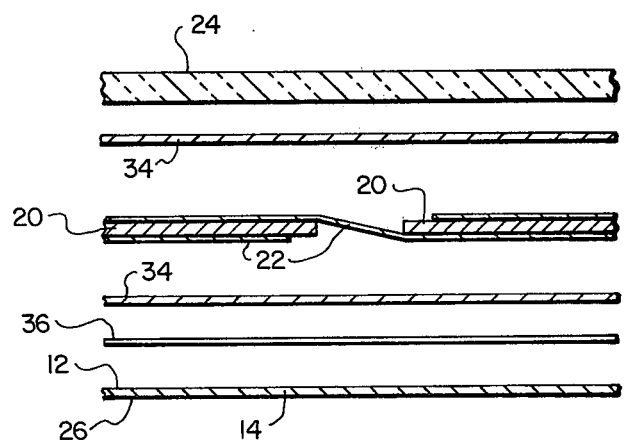
FIG. 4 is an exploded view showing the layers forming the laminated solar cell module of FIG. 1.

With reference now to FIG. 4, the overall laminated structure of module 10 is illustrated in an exploded view. The sheet metal pan 14 is illustrated as the bottom-most layer while glass sheet 24 is illustrated as the top-most layer. A pair of solar cells 20 and interconnect leads 22 are illustrated intermediate substrate 14 and superstrate 24. Two layers of pottant material 34, preferably EMA, are positioned between cells 20 and the substrate 14 and superstrate 24, respectively. An optional high voltage insulation layer 36 may also be provided immediately above metal substrate 14. Layer 36 may preferably comprise a sheet of polyvinyl fluoride which is commercially available under the trademark Tedlar TM. Layer 36 may be applied as a coating on substrate 14 or as a separate sheet of material bonded into the laminate structure simultaneously with the other layers. In a preferred form, insulation layer 36 comprises a sheet of polyester material in contact with substrate 14 as well as a layer polyvinyl fluoride. A suitable polyester is polyethylene terephthalate which is commercially available under the trademark Mylar TM.

Figure 5:
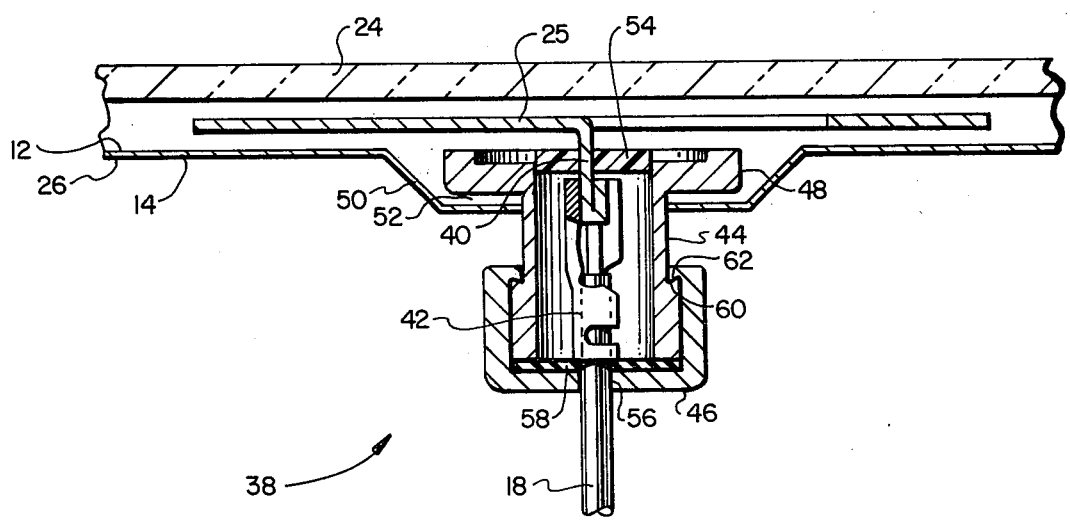
FIG. 5 is a cross-sectional view of the electrical terminal incorporated in the module of FIGS. 1 and 2.

With reference now to FIG. 5, details of the electrical terminals 38 are illustrated in a cross-sectional view. In FIG. 5, the substrate 14, superstrate 24 and contact pads 25 are illustrated as positioned after lamination. The pottant layers 34 are illustrated fused into a single layer within which all electrical circuitry is sealed for mechanical protection as well as electrical insulation purposes. In this embodiment, a portion 40 of contact pad 25 has been formed into a contact post adapted for receiving a snap-on connector 42 connected to an external lead 18. Mechanical and electrical protection for post 40 and connector 42 are provided by means of a housing 44 and a cap 46. Housing 44 is generally in the shape of a hollow cylinder which extends through an aperture in substrate 14. At one end of the housing 44, a circular flange 48 is formed to interlock with substrate 14 and thereby anchor the terminal structure 38 to the module 10. In this preferred embodiment, a recess 50 is formed in the substrate 14 so that the upper surface, as shown in the drawing, of the housing 44 is flush with the upper surface 12 of substrate 14. During the assembly process, it is preferred to provide a washer-shaped piece of the pottant 34 between flange 48 and surface 12 at the location indicated by reference 52 to seal housing 44 to surface 12. Use of this extra pottant material may not be necessary in a production situation if the basic pottant material 34 is found to flow sufficiently into all spaces. It is believed to be desirable to pour a small layer of rigid material 54, such as an epoxy resin, around a portion of post 40 so that forces applied to post 40 are transferred to housing 44 rather than to terminal pad 25.

Cap 46 is provided with an aperture 56 sized to accomodate external lead 18. In addition, a rubber seal 58 is preferably provided in cap 46 to provide a weathertight seal between cap 46 and wire 18 and between the cap and housing 44. Interlocking surfaces 60 and 62 are provided on the contacting surfaces of housing 44 and cap 46 to provide a snap-fit between the two parts. When fully assembled as illustrated in FIG. 5, this terminal arrangement provides a weather-proof seal to the electrical contact and mechanically isolates contact pad 25 from forces applied to external lead 18.

In addition to these structural strength features discussed above, the module 10 of the present invention provides considerable advantage in reduction of both material and labor costs involved in fabrication of solar cell modules. Many of these advantages will be apparent from the following description of the assembly of a module. The substrate 14 is roll formed from commercially available steel sheet particularly adapted to the roll forming operations. Such roll forming operations are highly automated with the result that the basic substrate 14 is relatively inexpensive. As noted above, the completed substrate 14 forms a pan having a bottom 12 and raised sides formed from the upturned flanges 28 and 30. Assembly of a completed module begins by inserting two of the terminal housings 44 into recesses 50 formed in the pan 14. If desired, washers of EMA material may be positioned between housing flanges 48 and pan 14. A sheet of EMA material 34 having dimensions corresponding to the surface 12 of pan 14 is then laid into the pan. The sheet is a simple rectangle although holes are provided at the locations of electrical contact posts 40. A solar cell circuit or string comprising cells 20 and interconnects 22 is then laid into the pan with posts 40 properly positioned in housings 44. A second layer of EMA pottant 34 is then positioned in the pan and finally the glass superstrate 24 is positioned on top of the first three layers. While in conventional panel assembly the multiple layers are thus stacked up before the lamination process, great care must normally be exercised to prevent shifting of the various layers in handling. The flanges 28 and 30 of pan module 14 act as positioning devices prior to the actual lamination step. The actual lamination step is performed in a conventional manner by application of vacuum, heat, and pressure to cause the EMA sheets 34 to become somewhat fluid and fuse to each other and the other layers forming the laminated structure. EMA material is preferred as a pottant over other possible pottants such polyvinyl butyral because the EMA becomes quite fluid when heated to normal laminating temperatures. As a result, the pottant 34 flows freely to conform to the shapes of cells 20 and fills the spaces between cells and also flows out from under edges of superstrate 24 to contact upturned flanges 28 and 30. As illustrated in FIG. 3, the pottant 34 thereby forms an edge seal around the edges of the module eliminating the need for additional sealing frame members. The edges of glass superstrate 24 are not only provided with a weather-tight seal but are mechanically protected by flanges 28 and 30 and the pottant 34 which flows out from edges of the laminate.

As suggested above, the assembly process may be modified by addition of high voltage insulation layer or layers 36 between substrate 14 and the lower pottant layer 34. The layer can be inserted as a separate sheet of material which is bonded in the lamination step. In the preferred embodiment, layer 36 is a coating applied to substrate 14 prior to the roll forming operation.

Upon completion of the lamination process the module is ready for final functional testing and shipping. Conventional framing steps are avoided. The mounting flanges 33 are easily punched or drilled to provide attachment points conforming to a permanent mounting structure. Inherent flexibility of sheet metal flanges 33 reduces stresses on module 10 which may normally result from permanent or thermally induced unevenness in the mounting structure. A plurality of modules 10 may be mounted side by side (with flanges 32 bolted together is desired) so that conduits 16 form a continuous raceway for wiring 18.

While the present invention has been illustrated and described with respect to particular structures and materials, it is apparent that various modifications and changes can be made within the scope of the present invention as defined by the appended claims.

What is claimed is:

1. A solar cell module comprising:
    a metal substrate formed from a single sheet of material having a generally rectangular planar central portion having upper and lower surfaces, upturned flanges extending essentially at right angles from edges of said upper surface, downturned flanges extending from at least two opposed upturned flanges at substantially right angles to said central portion and extending beyond said lower surface,
    a first pottant sheet covering and supported by said upper surface,
    a plurality of solar cells positioned on said first pottant sheet,
    a second pottant sheet covering and supported by said circuit and said first pottant sheet,
    a substantially transparent superstrate covering said second pottant sheet, and
    terminals extending through said metal substrate to provide external connections to said circuit,
    wherein said upturned flanges extend above said upper surface by a distance about equal to the combined thicknesses of said first and second pottant sheets, said circuit and said superstrate, and
    wherein said first and second pottant sheets are fused together and fill substantially all space between said substrate, said solar cells and said superstrate, and also fill the space between the edges of said superstrate and the inner surfaces of said upturned flanges to form a weatherproof seal around edges of said module.

2. A solar cell module according to claim 1 wherein each of said terminals comprises:
    an electrically insulating housing having a hollow cylindrical center portion having first and second ends, and an integral circular flange extending radially outward from said first end, and wherein said circular flange is positioned between said central portion and said circuit, said cylindrical center portion extends through an aperture in said metal substrate, and a conductor forming part of said circuit extends into said hollow cylindrical center portions for connection to an external conductor.

3. A solar cell module according to claim 2 wherein a recess, relative to said upper surface, is formed in said substrate around said aperture, said recess dimensions corresponding to dimensions of said circular flange.

4. A solar cell module according to claim 2 further including a cap dimensioned to fit over said housing center portion second end and having a central aperture for said external conductor, fastening means formed on said center portion and said cap to hold said cap on said center portion, and sealing means for providing a weathertight seal between said cap and said central portion and said external conductor.

5. A solar cell module according to claim 1 wherein said terminals are positioned near an edge of said rectangular central portion, further including a U-shaped conduit having a central portion parallel to and spaced from said lower surface, a first arm portion extending from said central portion to overlie and contact an outer surface of one of said upturned flanges, a second arm portion, shorter than said first arm portion, extending from said central portion to contact said lower surface, said conduit enclosing at least one terminal whereby said conduit provides a protected raceway for an external lead connected to said terminal.

6. A solar cell module according to claim 1 further including one or more sheets of high voltage insulating material positioned between said substrate central portion upper surface and said first pottant sheet.

7. A solar cell module according to claim 6 wherein said insulating material comprises polyvinyl fluoride.

8. A solar cell module according to claim 6 wherein said insulating material comprises polyethylene terephthalate.

9. A solar cell module according to claim 1 wherein said first and second pottant sheets are comprised of ethylene methyl acrylate.

* * * * *